United States Patent [19]
Plummer et al.

[11] Patent Number: 6,129,948
[45] Date of Patent: Oct. 10, 2000

[54] SURFACE MODIFICATION TO ACHIEVE IMPROVED ELECTRICAL CONDUCTIVITY

[75] Inventors: Howard K. Plummer, Dearborn; Robert C. McCune, Southfield; Jeffrey H. Helms, Plymouth, all of Mich.

[73] Assignee: National Center for Manufacturing Sciences, Ann Arbor, Mich.

[21] Appl. No.: 08/995,599

[22] Filed: Dec. 22, 1997

Related U.S. Application Data

[60] Provisional application No. 60/033,911, Dec. 23, 1996.

[51] Int. Cl.⁷ ........................................................ B05D 1/12
[52] U.S. Cl. ......................... 427/202; 427/180; 427/282; 427/421
[58] Field of Search .................... 427/191, 197, 427/199, 205, 282, 421, 427, 180, 202

[56] References Cited

U.S. PATENT DOCUMENTS

| | | | |
|---|---|---|---|
| 2,283,253 | 5/1942 | Haven | 91/12.2 |
| 4,403,398 | 9/1983 | Laurie et al. | 29/572 |
| 5,302,414 | 4/1994 | Alkhimov et al. | 427/192 |
| 5,330,790 | 7/1994 | Calkins | 427/204 |
| 5,409,741 | 4/1995 | Laude | 427/555 |
| 5,438,333 | 8/1995 | Perkins et al. | 342/4 |
| 5,484,838 | 1/1996 | Helms et al. | 524/496 |
| 5,591,382 | 1/1997 | Nahass et al. | 252/511 |
| 5,795,626 | 8/1998 | Gabel et al. | 427/458 |

OTHER PUBLICATIONS

E/M Corporation, "MICROSEAL; A unique solid thin film lubricant", 1989.

*Primary Examiner*—Shrive Beck
*Assistant Examiner*—Michael Barr
*Attorney, Agent, or Firm*—Gifford, Krass, Groh, Sprinkle, Anderson & Citkowski, PC

[57] ABSTRACT

A high-velocity spray nozzle is used to physically embed conductive particles into the surface of a non-conductive substrate, thereby rendering it electrically conductive. In contrast to existing, chemically based alternatives, the method offers the use of a dry process with no chemical baths and associated environmental concerns; the ability to produce localized modifications, only in areas where actually required; the use of simple materials, such as air and powdered graphite; and a potential cost savings. Methods of modifying localized areas of the underlying substrate are also disclosed.

11 Claims, 9 Drawing Sheets

(8 of 9 Drawing Sheet(s) Filed in Color)

High velocity particle approaching surface.

Embedded carbon or metal particles

Surface of Polymer

SURFACE MODIFICATION TO ACHIEVE IMPROVED ELECTRICAL CONDUCTIVITY

REFERENCE TO RELATED APPLICATION

This application claims priority of U.S. provisional application Ser. No. 60/033,911, filed Dec. 23, 1996, the entire contents of which are incorporated herein by reference.

FIELD OF THE INVENTION

This invention relates generally to surface modification and, in particular, to the application of high-velocity, low-temperature particle spray techniques to improve the electrical conductivity of low-conductivity or insulating substrate surfaces.

BACKGROUND OF THE INVENTION

There exists a wide variety of surface modification processes for use in conjunction with metallic materials, including diffusional processes, coatings, and mechanical and thermal treatments. U.S. Pat. No. 3,100,724 to C. F. Rocheville, for example, describes an apparatus for coating a surface with metallic powders or lubricating particles, as well as the use of glass beads to abrade a surface. In 1990, a paper by A. P. Alkhimov et al described what is called a cold gas-dynamic deposition process, in which they claimed to be able to deposit a thick layer of aluminum onto a substrate using air or a mixture of helium and air at high pressure accelerated through a supersonic nozzle. In 1994 Alkhimov et al received U.S. Pat. No. 5,302,414 for a method and an apparatus for a "Gas-Dynamic Spraying Method for Applying a Coating," which they claimed would produce thick layers of a number of metals and metal alloys onto metals, ceramics and glass without heat insulation. Follow-up work produced reasonably thick coatings of Al, Cu on aluminum on alumina, steel on aluminum and Ni—Cr/Cr3C2 on Ti6Al-4V. A 1995 paper by H. Gabel describes a kinetic energy implantation technique, which produces kinetic energy metallization and kinetic energy polymerization to produce metal and polymer coatings, respectively. The inventor, however, describes the coatings as hard, non-conductive surfaces on polymers and metals.

For a great number of polymeric materials, the relative inertness and poor thermal stability of the surface make the materials unsuitable for such surface modification techniques. In particular, the application of electrostatically-based powder coatings to many polymers requires a conductive surface which is often difficult and costly to produce. The need remains, therefore, for a surface modification technique which may be readily applied to polymers and/or ceramic surfaces.

SUMMARY OF THE INVENTION

This invention resides in a method and delivery apparatus for providing an electrically conductive surface on various low-conductivity or insulating surfaces in a straightforward and cost-effective manner. In brief, the method employs a high-velocity spray nozzle to physically embed conductive particles into the surface of a substrate, such as a polymer or a ceramic, being treated, thereby rendering it substantially electrically conductive. Advantages of the process over existing, chemically based alternatives are: 1) use of a dry process with no chemical baths and associated environmental concerns; 2) the ability to produce localized modifications, only in areas where actually required; 3) the use of simple materials (e.g., air and powdered graphite); and 4) potential cost savings.

Use of the method offers various advantages in different fields of applications. For example, by rendering an otherwise non-conductive surface electrically conductive, electrostatic painting techniques may be used for reduced overspray, as they are with metallic substrates, allowing plastic parts, for example, to be painted along with metal counterparts for an improved color match. Enclosures made of otherwise low conductivity or non-conductive plastic or other polymeric materials may be modified according to the invention, enabling them to be ground, for example, for improved RF shielding. In a further embodiment, through the use of patterning, which may be carried out either through a refined, controlled spray or masking operation, multiple electrically conductive paths may be created on low conductivity or non-conducting substrates, thereby taking advantage of the inherent insulating properties of the underlying support structure.

BRIEF DESCRIPTION OF THE DRAWINGS

The file of this patent contains at least one drawing executed in color. Copies of this patent with color drawing (s) will be provided by the Patent and Trademark Office upon request and payment of the necessary fee.

DETAILED DESCRIPTION OF THE PREFERRED EMBODIMENT

Figure 1:
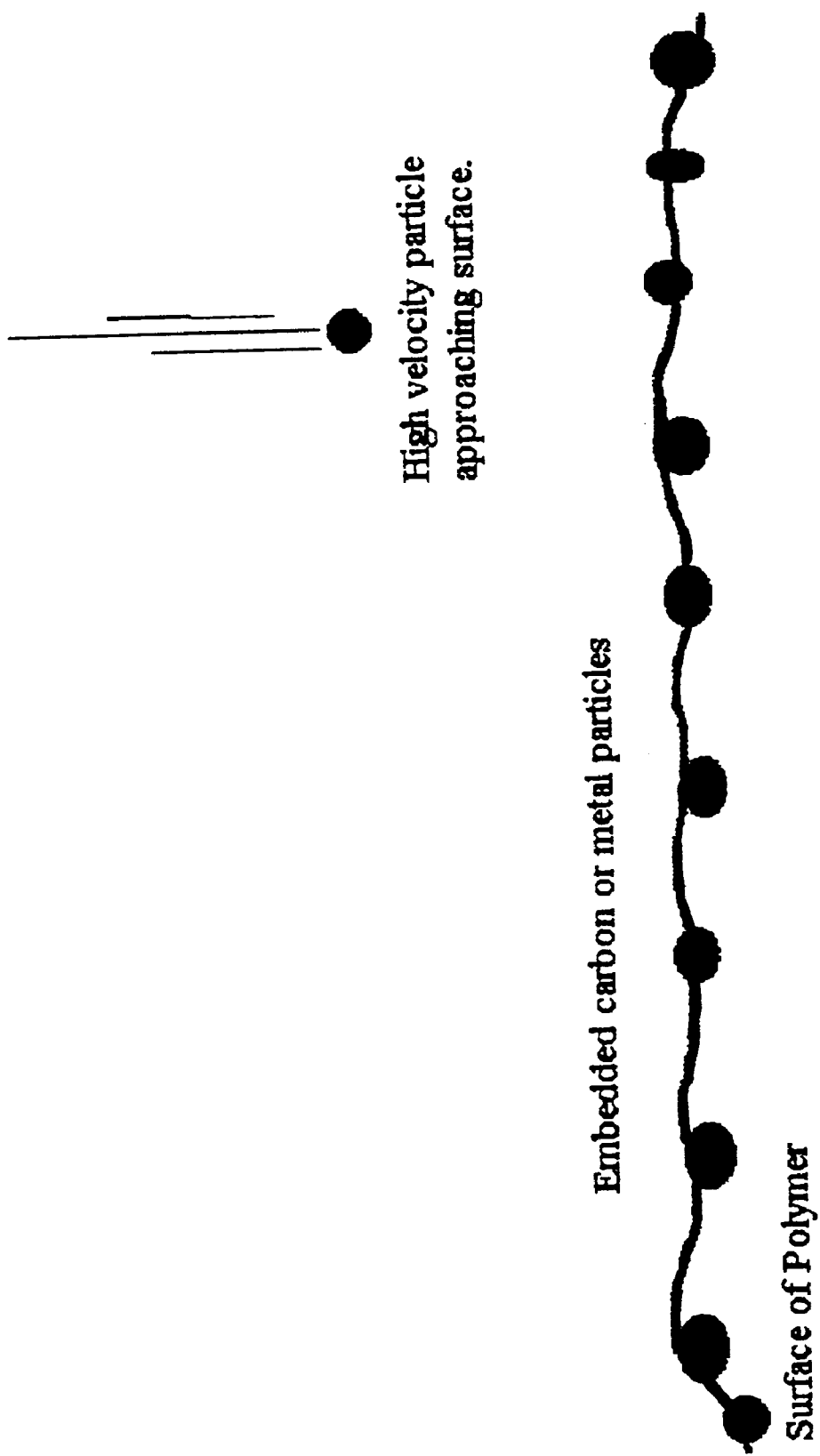
FIG. 1 is a schematic representation of a coating/embedding process according to the invention.

In accordance with this invention, an apparatus similar to that described in U.S. Pat. No. 5,302,414 is used to produce a conductive coating which embeds discrete particles in the surface of an underlying low-conductivity or insulating substrate (see FIG. 1). Onto the surface of the appropriate non-conducting substrate, a thick conducting layer may be created through the build-up of relatively small (i.e., <50 um) metallic, conductive graphite or conductive carbon particles, which are accelerated to high, preferably supersonic velocity using compressed air or another appropriate gas passing through a supersonic nozzle.

As used herein, the term "polymer" will be used to identify a class of polymers amenable to the method of the invention, this class of materials being defined by a range of physical properties, such as transition temperatures of less than $-40°$ C.; relatively low molecular weight; and dimensional stability (for example $-40°$ F.–$120°$ F., which satisfies most automotive and military specifications). The invention is applicable to a family of polymers, including thermoplastic polyolefin (TPO), polypropylene (PP), polymethyl methacrylate (PMMA), polycarbonate, nylon, phenolics, acrylics, resins, thermoset epoxies, sheet molding compound (SMCs), and acrylonitrile-butadiene-strene (ABS).

Figure 2:
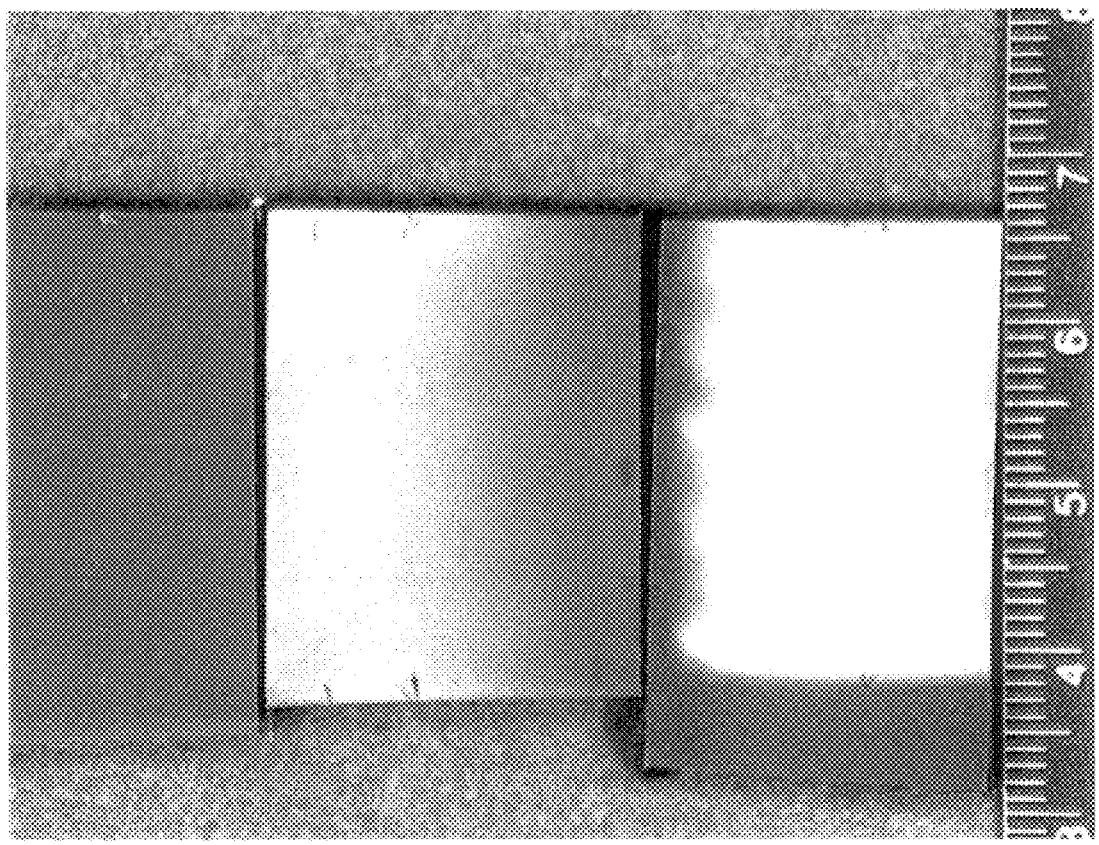
FIG. 2 is a low-magnification photograph illustrating uncoated TPO and coated graphite.
Figure 3A:
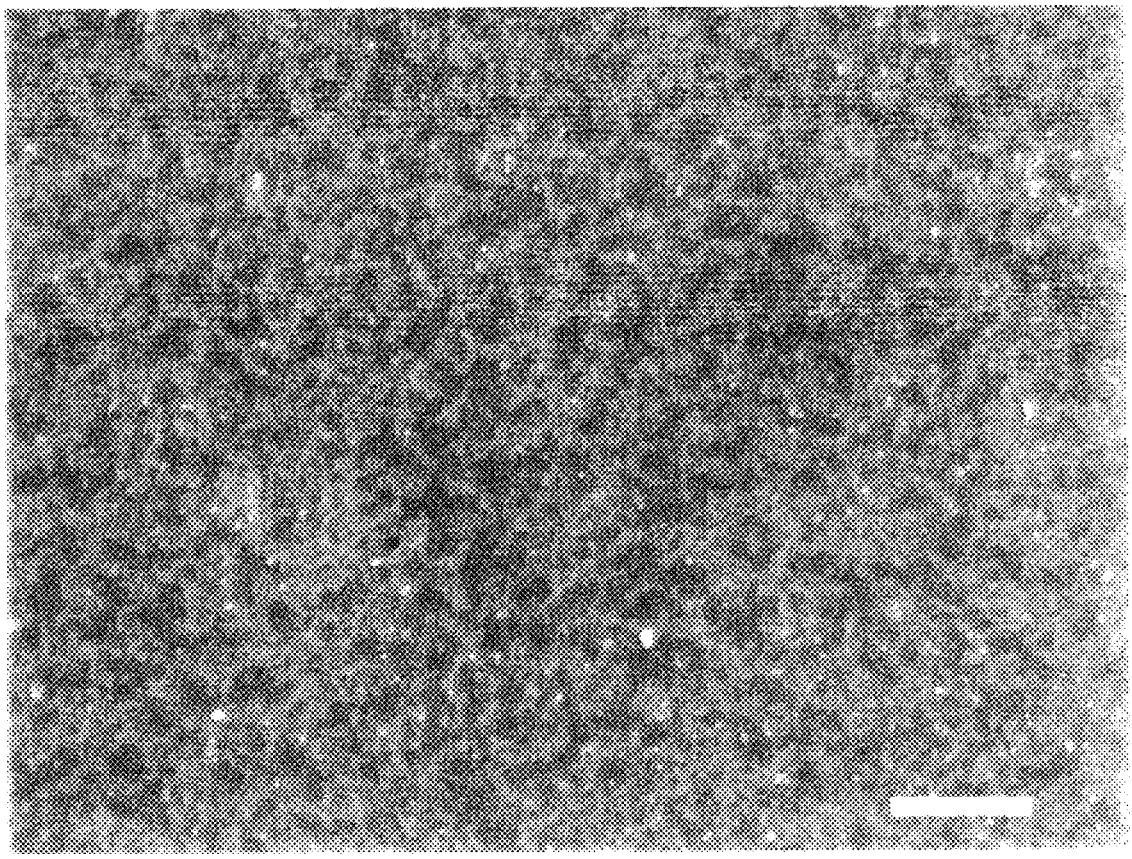
FIG. 3A is a higher magnification view representative of the surface of the uncoated TPO of FIG. 2.
Figure 3B:
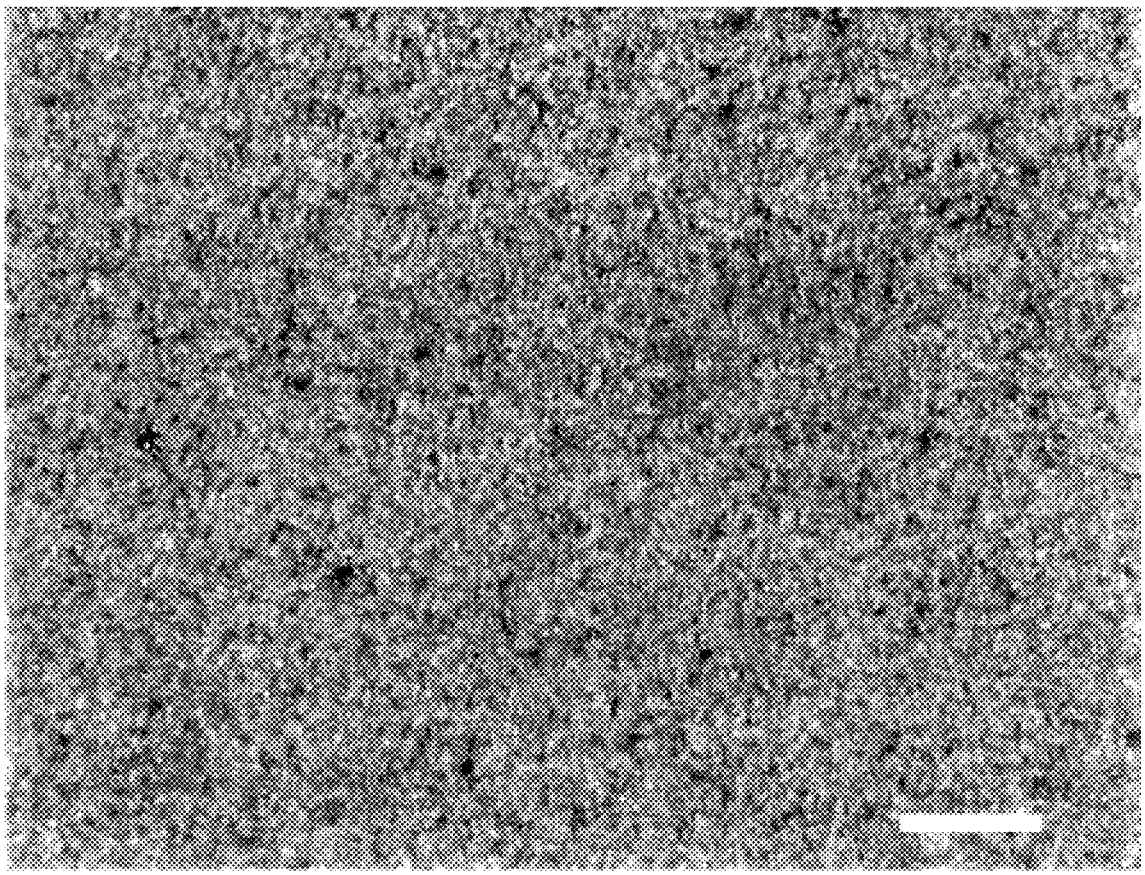
FIG. 3B is a higher magnification representation of the coated TPO surface of FIG. 2.
Figure 4:
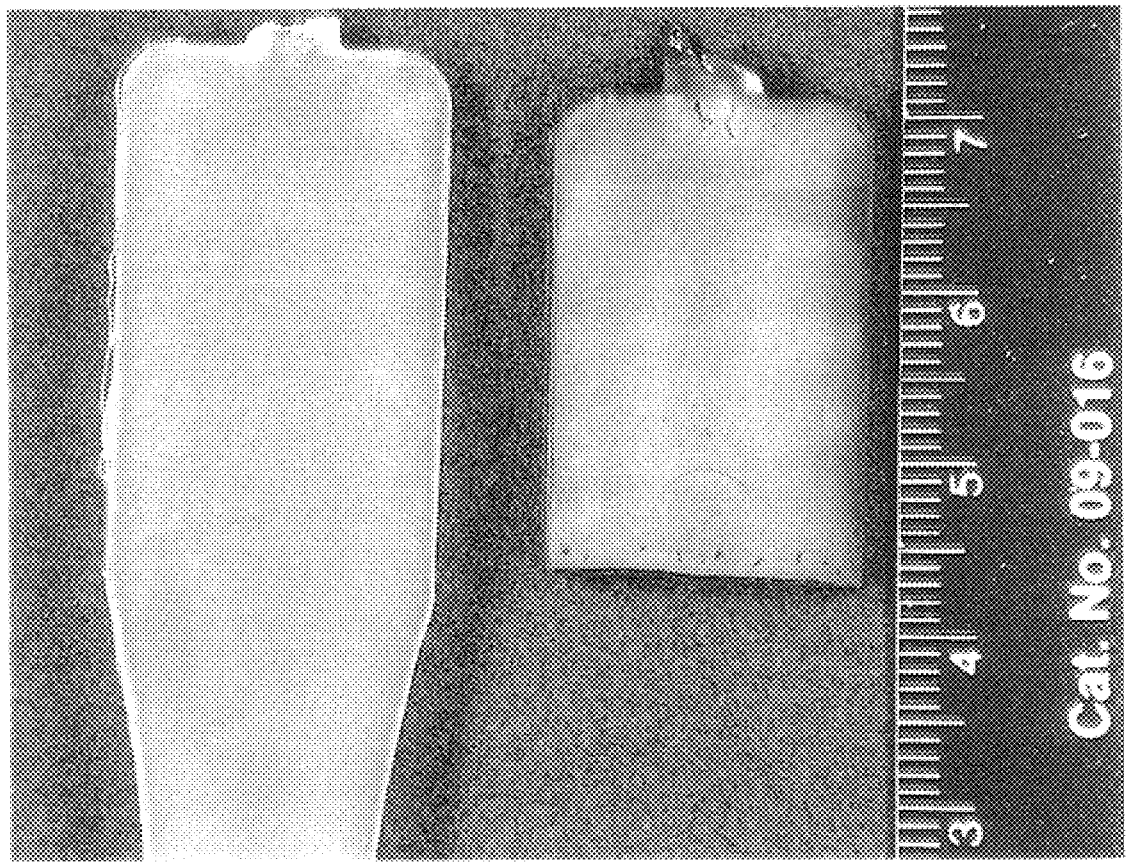
FIG. 4 is a photograph showing uncoated polypropylene and spray coated graphite on polypropylene.
Figure 5A:
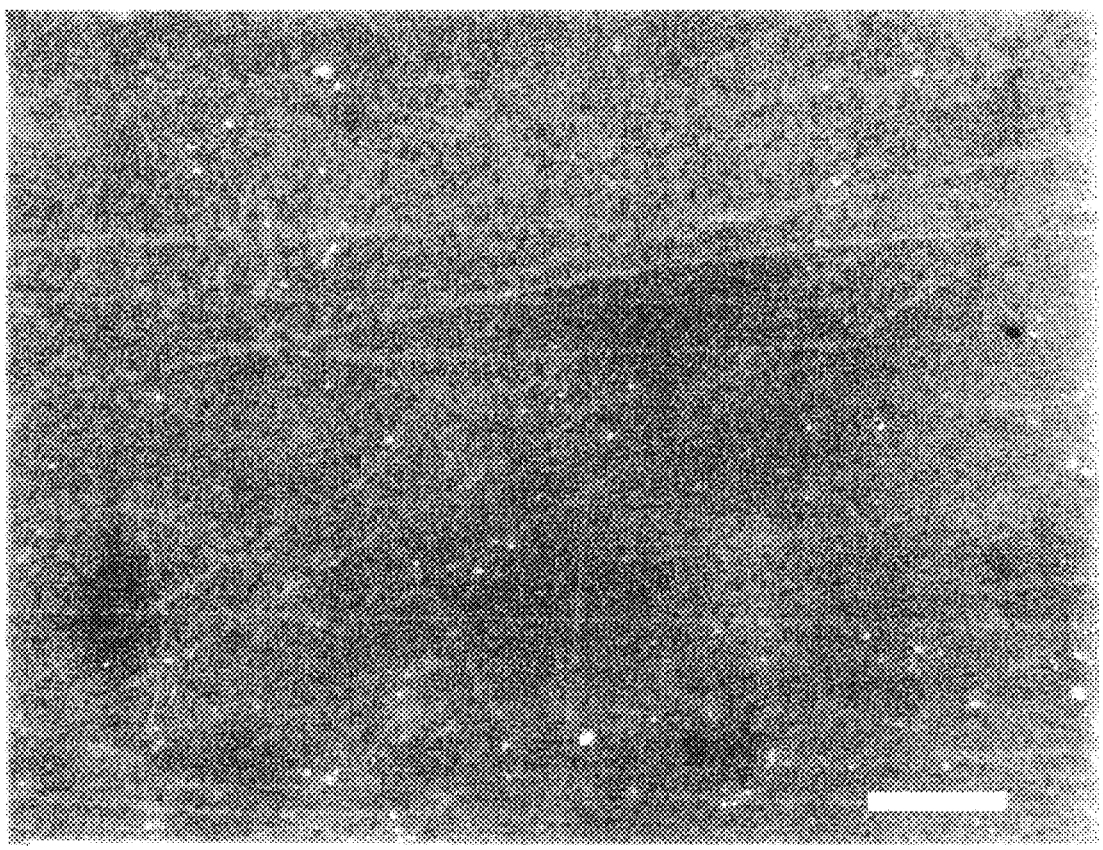
FIG. 5A is a higher magnification view of the surface of the uncoated polypropylene of FIG. 4.
Figure 5B:
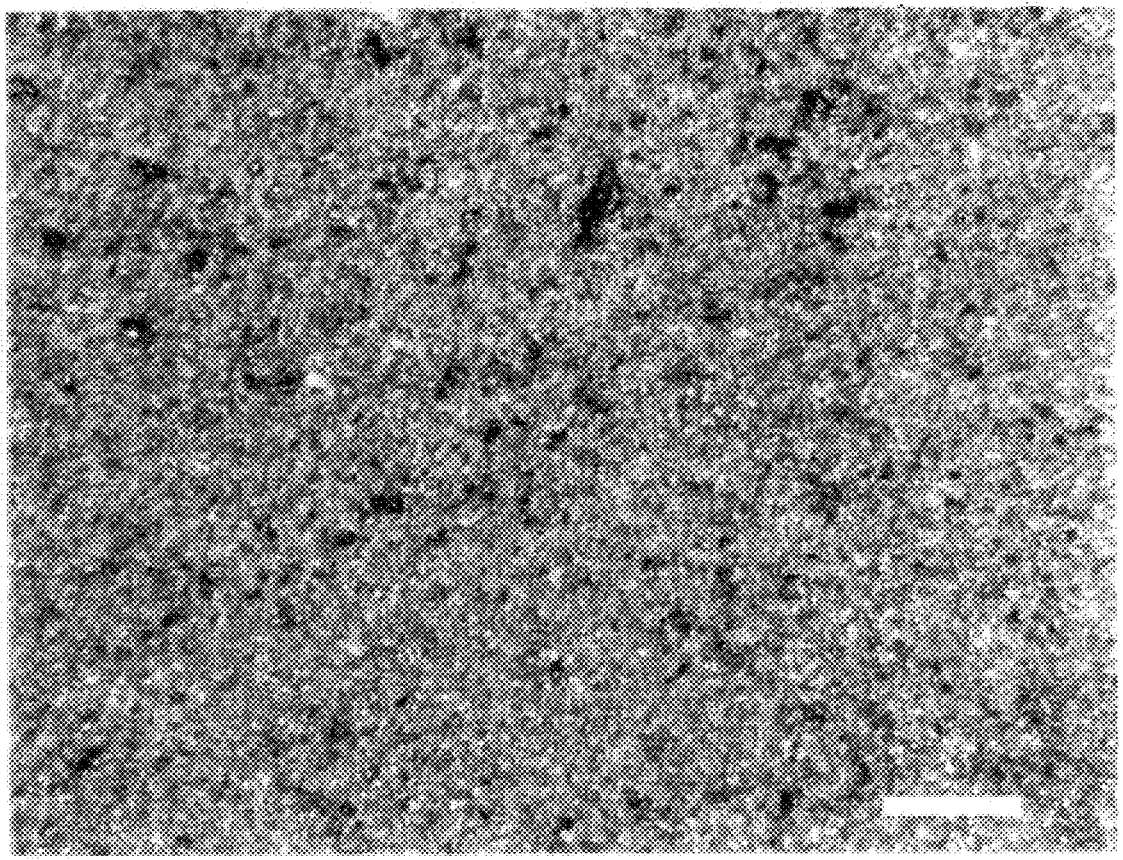
FIG. 5B is a higher magnification view of the surface of the polypropylene coated with graphite of FIG. 4.
Figure 6:
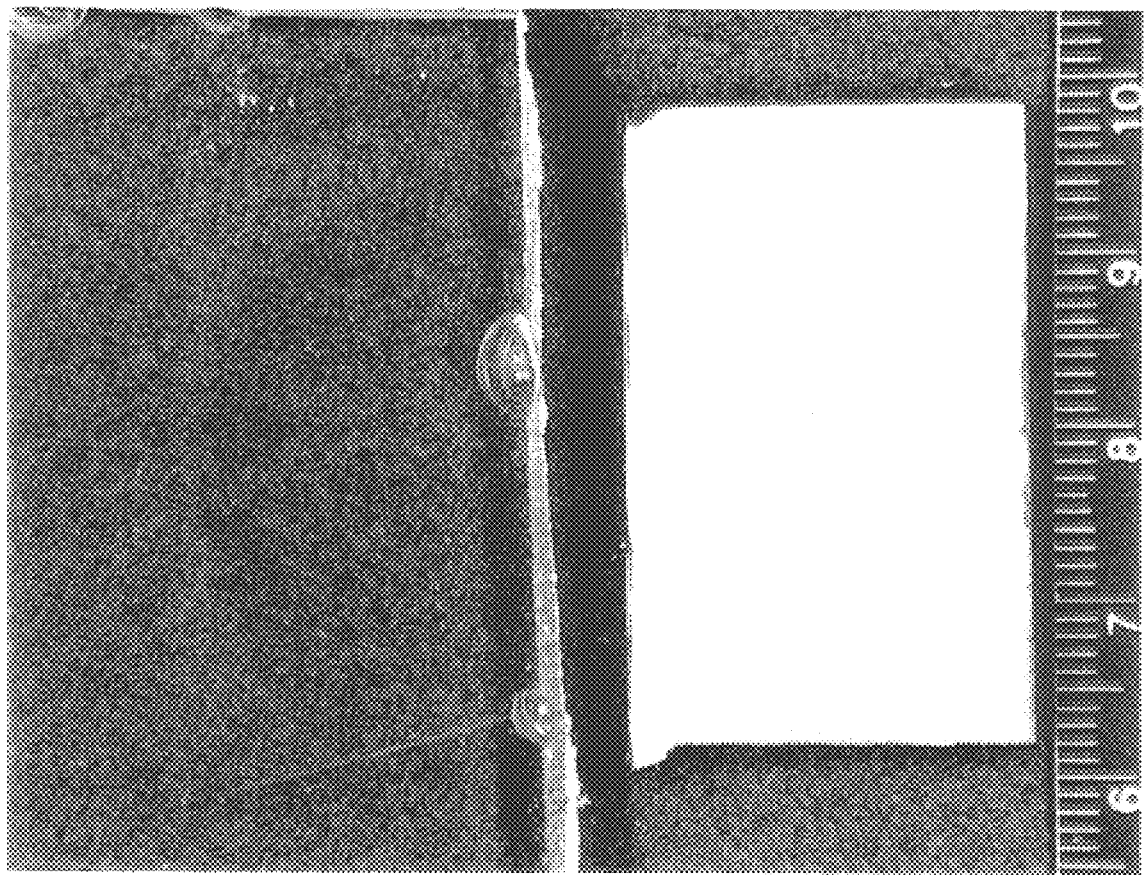
FIG. 6 is a photograph showing uncoated polymethyl methacrylate and spray coated Al/Sn on PMMA.
Figure 7:
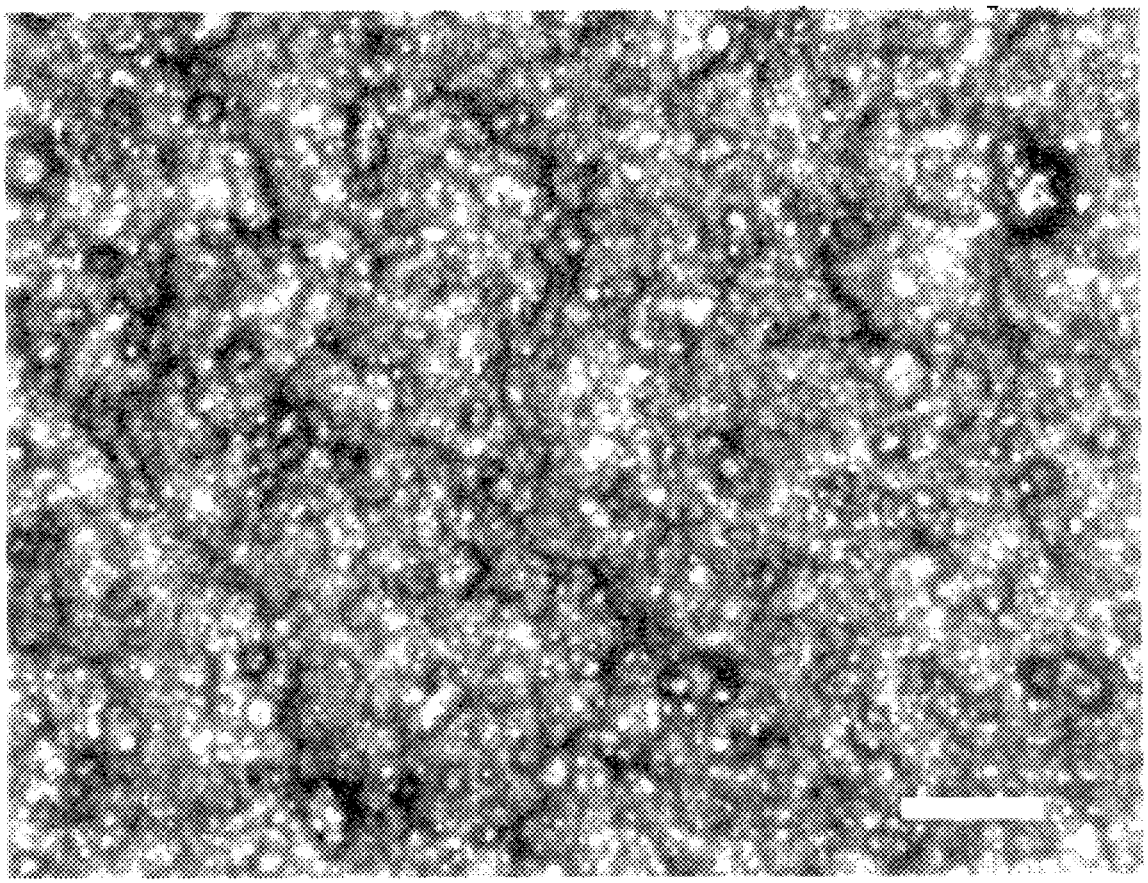
FIG. 7 is a higher surface magnification of the spray coated Al/Sn on PMMA of FIG. 6.

For metals, there exists data tending to define a "percolation" limit for the volume fraction needed to obtain reduced electrical resistivity. In the case of this invention, there is not an actual "layer," but an electrically modified surface. FIGS. 2–5 exhibit, at low magnification and at slightly higher magnification, the lighter surface areas on the polymer substrates that have received an implantation of conductive graphite. Specifically, FIG. 2 is a low-magnification photograph illustrating uncoated TPO and TPO modified through the implantation of graphite particles. The ruler to the right in FIGS. 2, 4 and 6 is in millimeters. The bar at the bottom right in FIGS. 3, 5 and 7 represents 200 μm.

At higher magnification (FIGS. 3 and 5) some of the individual particles can be observed on the polymer surfaces. The layers are composed of individual particles embedded in the polymer surface but the resistivity measurements given in Table 1 below show conductivity [most polymers including TPO, PP and PMMA feature initial surface resistivities greater than $10^{10} \Omega/sq$]:

TABLE 1

SURFACE RESISTANCE VS. PROCESS VARIABLES

| Substrate Material | Distance From Nozzle (inch) | Coating Particles | Resistivity (ohm/sq) |
| --- | --- | --- | --- |
| Polypropylene PD701 | 1.25 | KS25 Graphite | 5,000 |
| Polypropylene PD701 | 0.3 | KS25 Graphite | 1,086 |
| Polypropylene 6823 | 0.3 | KS25 Graphite | 1,154 |
| D161A TPO | 1.25 | KS25 Graphite | 1,679 |
| D161A TPO | 0.3 | KS25 Graphite | 593 |
| PMMA | 1.25 | Al/Sn Powder | 0.033 |

Note: All runs were made with compressed air at an inlet pressure of 300 psi; the particulates, substrates and standoff distances as specified in the table. The spray nozzle in this case has a square inlet cross section of dimension 1.5×1.5 mm, a length of 70 mm, and outlet length of 7.5 mm with width of 1.5 mm.

FIG. 6 shows uncoated PMMA, and PMMA coated with a layer produced from sprayed aluminum/tin particles. FIG. 7 is a higher magnification view of the Al/Sn coated PMMA. The Al/Sn coating is continuous, and exhibits higher conductivity than that seen with graphite coated polymers.

What has been disclosed is a method and certain aspects of a delivery apparatus capable of enhancing the surface conductivity of non-conductive substrates, including polymers and ceramics, at least those chosen from particular classes of materials. In addition to converting what is otherwise a non-conductive substrate into one which carries electricity at least with respect to its surface, the method according to the invention may be used in conjunction with the modification of localized areas on such non-conductive substrates, thereby creating conductive paths that are inherently isolated by the non-conductive substrate material. Such paths may be created in a number of ways according to the invention, including the use of a relatively small cross-section nozzle delivering particles at a substantially short distance from the substrate, thereby ensuring relatively low bleed of deposition outside of the nozzle striking area or, alternatively, a mask may be used over the underlying non-conductive substrate to receive particles prior to their being embedded, thereby realizing even more sharply defined conductive areas.

As discussed in the summary of the invention, when used to coat entire surfaces, the invention facilitates the use of, for example, electrostatic painting of otherwise low-conductivity or electrically insulating materials, thereby enabling such materials, including plastics, to be painted in a manner to that now used for metal parts. This would allow metal parts and non-metal parts with coatings according to the invention to be treated along the same assembly lines. In further embodiments, low-conductivity or insulating enclosures may be used and grounded, for example, to reduce electromagnetic interference in an RF shielding application.

What is claimed is:

1. A method of improving the electrical conductivity of a polymeric substrate, comprising the steps of:

providing a polymeric substrate which is substantially electrically non-conductive;

directing a spray of graphite particles toward the surface of the substrate at a supersonic velocity, the size of the particles being in the range of from 1 to 50 micrometers; and embedding a sufficient quantity of the graphite particles into the surface of the substrate to bring about a decrease in electrical resistivity in the range of 7–12 orders of magnitude, at least at the substrate surface.

2. The method of claim 1, wherein the non-conductive substrate is polypropylene.

3. The method of claim 1, wherein the non-conductive substrate is thermoplastic polyolefin.

4. The method of claim 1, wherein the non-conductive substrate polymethylmethacrylate.

5. The method of claim 1, wherein the step of embedding a sufficient quantity of the particles into the surface of the substrate includes the step of embedding such particles only in localized areas, thereby creating isolated, conductive pads thereon.

6. The method of claim 5, wherein the localized areas are created through the use of a nozzle positioned above the underlying substrate.

7. The method of claim 5, further including the step of providing a mask to define such localized conductive regions.

8. A method of improving the electrical conductivity of a ceramic substrate, comprising the steps of:

providing a ceramic substrate which is substantially electrically non-conductive;

directing a spray of graphite particles toward the surface of the substrate at a supersonic velocity, the size of the particles being in the range of 1–50 micrometers; and embedding a sufficient quantity of the graphite particles into the surface of the substrate to bring about a decrease in electrical resistivity in the range of 7–12 orders of magnitude, at least at the substrate surface.

9. The method of claim 8, wherein the step of embedding a sufficient quantity of the particles into the surface of the substrate includes a step of embedding such particles only in localized areas, thereby creating isolated, conductive pads thereon.

10. The method of claim 9, wherein the localized areas are created through the use of a nozzle positioned above the substrate.

11. The method of claim 9, further including the step of providing a mask to define the localized conductive regions.

* * * * *